United States Patent
Dorairaj (10) Patent No.: US 7,795,913 B2
(45) Date of Patent: Sep. 14, 2010

(54) PROGRAMMABLE LATCH BASED MULTIPLIER

(75) Inventor: Nij Dorairaj, Campbell, CA (US)

(73) Assignee: Tier Logic, Santa Clara ( * ) Notice: Subject to any disclaimer, the term of this patent is extended or adjusted under 35 U.S.C. 154(b) by 370 days.

(21) Appl. No.: 12/015,461

(22) Filed: Jan. 16, 2008

(65) Prior Publication Data

US 2009/0167348 A1 Jul. 2, 2009

Related U.S. Application Data

(63) Continuation-in-part of application No. 11/964,084, filed on Dec. 26, 2007.

(51) Int. Cl.
*H03K 19/173* (2006.01)
(52) U.S. Cl. .......................... 326/46; 326/38
(58) Field of Classification Search ............. 326/37–41, 326/46
See application file for complete search history.

(56) References Cited

U.S. PATENT DOCUMENTS

| | | |
|---|---|---|
| 4,609,986 A | 9/1986 | Hartmann et al. |
| 4,706,216 A | 11/1987 | Carter |
| 4,761,768 A | 8/1988 | Turner et al. |
| 4,864,161 A | 9/1989 | Norman et al. |
| 4,870,302 A | 9/1989 | Freeman |
| 4,873,459 A | 10/1989 | El Gamal et al. |
| 5,164,612 A | 11/1992 | Kaplinsky |
| 5,191,241 A | 3/1993 | McCollum et al. |
| 5,216,636 A | 6/1993 | Runaldue |
| 5,343,406 A | 8/1994 | Freeman et al. |
| 5,347,519 A | 9/1994 | Cooke et al. |
| 5,488,316 A | 1/1996 | Freeman et al. |
| 5,563,526 A | 10/1996 | Hastings et al. |
| 5,581,501 A | 12/1996 | Sansbury et al. |
| 5,612,631 A | 3/1997 | Agrawal et al. |
| 5,625,221 A | 4/1997 | Kim et al. |
| 5,679,967 A | 10/1997 | Janai et al. |
| 5,684,744 A | 11/1997 | Orgill et al. |
| 5,701,233 A | 12/1997 | Carson et al. |
| 5,744,981 A * | 4/1998 | Sasaki et al. ................ 326/48 |
| 5,793,115 A | 8/1998 | Zavracky et al. |
| 5,835,405 A | 11/1998 | Tsui et al. |
| 5,844,422 A | 12/1998 | Trimberger et al. |
| 5,880,598 A | 3/1999 | Duong |
| 5,943,574 A | 8/1999 | Tehrani et al. |
| 5,944,813 A * | 8/1999 | Trimberger ................ 712/36 |
| 5,949,710 A | 9/1999 | Pass et al. |
| 5,949,719 A | 9/1999 | Clinton et al. |
| 6,005,806 A | 12/1999 | Madurawe et al. |
| 6,018,476 A | 1/2000 | Madurawe et al. |
| 6,097,211 A | 8/2000 | Couts-Martin et al. |

(Continued)

OTHER PUBLICATIONS

Ashok K. Sharma, "Programmable Logic Handbook—PLDs, CPLDs, & FPGAs", 1998, pp. 99-171, McGraw-Hill, USA.

(Continued)

*Primary Examiner*—Don P Le
(74) *Attorney, Agent, or Firm*—Tran & Associates (57) ABSTRACT

A programmable logic circuit is disclosed that includes a latch for enhancing the circuit logic capacity. In a multiplier configuration, the circuit comprises a logic block; and a latch having a latch output coupled to a logic block input, wherein the latch output computes an AND function of a first and second latch input.

20 Claims, 12 Drawing Sheets

U.S. PATENT DOCUMENTS

| | | | |
|---|---|---|---|
| 6,134,171 | A | 10/2000 | Yamagata et al. |
| 6,134,173 | A | 10/2000 | Cliff et al. |
| 6,191,614 | B1 | 2/2001 | Schultz et al. |
| 6,242,767 | B1 | 6/2001 | How et al. |
| 6,259,271 | B1 | 7/2001 | Couts-Martin et al. |
| 6,262,596 | B1 | 7/2001 | Schultz et al. |
| 6,275,064 | B1 | 8/2001 | Agrawal et al. |
| 6,275,065 | B1 | 8/2001 | Mendel |
| 6,331,784 | B1 | 12/2001 | Mason et al. |
| 6,331,789 | B2 | 12/2001 | Or-Bach |
| 6,337,579 | B1 | 1/2002 | Mochida |
| 6,340,830 | B1 | 1/2002 | Takemura |
| 6,353,562 | B2 | 3/2002 | Bohm et al. |
| 6,359,469 | B1 * | 3/2002 | Mendel et al. ................. 326/40 |
| 6,420,925 | B1 | 7/2002 | Fifield et al. |
| 6,426,649 | B1 | 7/2002 | Fu et al. |
| 6,448,808 | B2 | 9/2002 | Young et al. |
| 6,480,027 | B1 | 11/2002 | Ngai et al. |
| 6,496,887 | B1 | 12/2002 | Plants |
| 6,504,742 | B1 | 1/2003 | Tran et al. |
| 6,515,511 | B2 | 2/2003 | Sugibayashi et al. |
| 6,525,953 | B1 | 2/2003 | Johnson |
| 6,551,857 | B2 | 4/2003 | Leedy |
| 6,582,980 | B2 | 6/2003 | Feldman et al. |
| 6,613,611 | B1 | 9/2003 | How et al. |
| 6,614,259 | B2 | 9/2003 | Couts-Martin et al. |
| 6,627,985 | B2 | 9/2003 | Huppenthal et al. |
| 6,737,675 | B2 | 5/2004 | Patel et al. |
| 6,738,962 | B1 | 5/2004 | Flaherty et al. |
| 6,798,240 | B1 | 9/2004 | Pedersen |
| 6,812,731 | B1 | 11/2004 | Trimbrger |
| 6,911,730 | B1 | 6/2005 | New |
| 6,943,580 | B2 * | 9/2005 | Lewis et al. .................... 326/40 |
| 6,946,330 | B2 | 9/2005 | Yamazaki et al. |
| 6,954,084 | B2 | 10/2005 | Islam |
| 6,992,503 | B2 | 1/2006 | Madurawe |
| 6,998,722 | B2 | 2/2006 | Madurawe |
| 7,019,557 | B2 | 3/2006 | Madurawe |
| 7,030,651 | B2 | 4/2006 | Madurawe |
| 7,064,018 | B2 | 6/2006 | Madurawe |
| 7,064,579 | B2 | 6/2006 | Madurawe |
| 7,084,666 | B2 | 8/2006 | Madurawe |
| 7,112,994 | B2 | 9/2006 | Madurawe |
| 7,129,747 | B1 * | 10/2006 | Jang et al. ...................... 326/38 |
| 7,176,713 | B2 | 2/2007 | Madurawe |
| 7,253,659 | B2 | 8/2007 | Madurawe |
| 7,268,580 | B2 | 9/2007 | Madurawe |
| 2001/0003428 | A1 | 6/2001 | Or-Bach |
| 2001/0019155 | A1 | 9/2001 | Warashina et al. |
| 2001/0028059 | A1 | 10/2001 | Emma et al. |
| 2001/0047509 | A1 | 11/2001 | Mason et al. |
| 2002/0177260 | A1 | 11/2002 | Matsumoto |
| 2002/0186044 | A1 | 12/2002 | Agrawal et al. |
| 2003/0001615 | A1 | 1/2003 | Sueyoshi et al. |
| 2003/0023762 | A1 | 1/2003 | Dhir et al. |
| 2003/0085733 | A1 | 5/2003 | Pugh et al. |
| 2003/0227056 | A1 | 12/2003 | Wang et al. |
| 2005/0023656 | A1 | 2/2005 | Leedy |

OTHER PUBLICATIONS

Alexander, et al., "Three-Dimensional Field-Programmable Gate Arrays", Proceedings of the 8$^{th}$ Annual IEEE International ASIC Conference and Exhibit, 1995, pp. 253-256.

* cited by examiner

PROGRAMMABLE LATCH BASED MULTIPLIER

This application is a continuation in part application of Ser. No. 11/964,084 filed Dec. 26, 2007 and entitled "USING PROGRAMMABLE LATCH TO IMPLEMENT LOGIC", the content of which is incorporated by reference.

BACKGROUND

In electronics, a latch is a kind of bistable multivibrator, an electronic circuit which has two stable states and thereby can store one bit of information. Today the word is mainly used for simple transparent storage elements, while slightly more advanced non-transparent (or clocked) devices are described as flip-flops. When using static gates as building blocks, the most fundamental latch is the simple SR latch (or simple SR flip-flop), where S and R stand for set and reset. Other types include D, JK, T and Clocked Flip-Flops. It can be constructed from a pair of cross-coupled NAND (negative AND) and NOR (negative OR) type logic gates. The stored bit is present on the output marked Q. Normally, in storage mode, the S and R inputs are both low, and feedback maintains the Q and !Q outputs in a constant state, with !Q meaning the complement of Q. If S (Set) is pulsed high while R is held low, then the Q output is forced high, and stays high when S returns low; similarly, if R (Reset) is pulsed high while S is held low, then the Q output is forced low, and stays low when R returns low.

Figure 1:
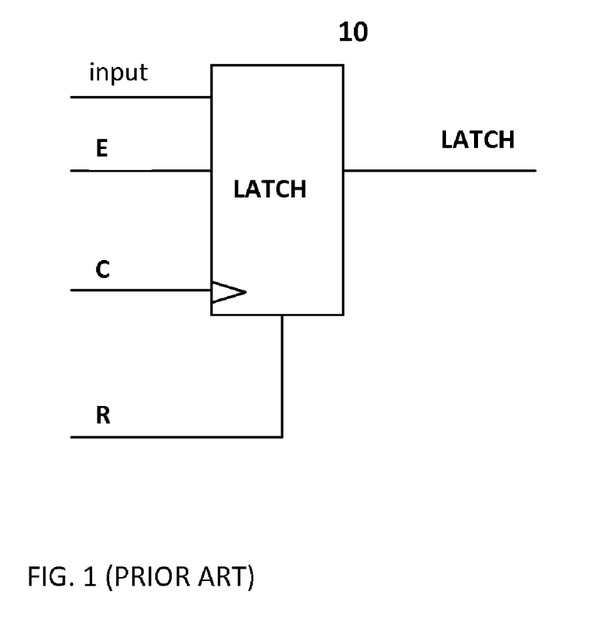

FIG. 1 shows an exemplary synchronous SR latch 10. The synchronous SR latch 10 (sometimes clocked SR flip-flop) can be made by adding a second level of NAND gates to the inverted SR latch (or a second level of NOR gates to the direct SR latch). The extra gates further invert the inputs so the simple SR latch becomes a gated SR latch (and a simple SR latch would transform into a gated SR latch with inverted enable). With E high (enable true) and with the correct clock C transition edge, the signals can pass through the input gates to the encapsulated latch. With E low (enable false) the latch is closed and remains in the state it was left the last time E was high and a rising edge of clock C, for example. A circuit incorporating latches has state; its output may depend not only on its current input, but also on its previous inputs. Such a circuit is described as sequential logic. A plurality of latches is coupled to one or more global control signals to set, reset and clock storage data.

Another commonly used circuit in digital processing is a multiplier. The multiplier is a hardware circuit dedicated to multiplying two binary values. A variety of computer arithmetic techniques can be used to implement a digital multiplier. Most techniques involve computing a set of partial products, and then summing the partial products together. This process is similar to conducting long multiplication on base-10 integers, but has been modified here for application to a base-2 (binary) numeral system. The binary multiplication process consists of a series of shifts and adds.

SUMMARY

In one aspect, a programmable logic circuit to implement a multiplier includes a latch with a latch input coupled to a first data input; a latch control input coupled to a second data input; and a latch output generating an AND function of the latch input and the control input. The logic circuit also includes a logic block with an input coupled to the latch output; one or more data inputs; and a logic output that generates a partial logic term of a multiply operation.

Implementations of the above aspect may include one or more of the following. The control input can be a clock input, set input, or reset input. The first data input can be a bit in a first data string and the second data input can be a second bit in a data string and wherein the circuit implements the multiplication of the two data strings. The partial logic term can be an AND or XOR logic functions of latch output and one or more logic block data inputs. The logic block can be a plurality of programmable inputs. The latch data input and latch control input can be programmable. The logic block can be one or more of programmable look-up-table (LUT) circuit, programmable multiplexer (MUX) circuit, programmable arithmetic logic circuit and programmable AND circuit and programmable NAND circuit. The inputs can be connected to a programmable interconnect matrix through configurable multiplexer circuits. The circuit can include configuration memory elements such as SRAM, DRAM, EPROM, EEPROM, ROM, fuse-link, anti-fuse capacitor, magnetic, optical, ferro-electric, resistive, or mechanical memory elements.

In another aspect, a method of implementing a multiply logic function in a programmable logic block includes coupling a first input to a programmable data input of a latch and a second input to a programmable control input of a latch to generate an AND term of the first and second inputs at a latch output; coupling the latch output and one or more data inputs to programmable inputs of a programmable logic block to generate a partial logic term of the inputs.

Implementations of the above aspect may include one or more of the following. The partial logic term can be used to compute one of: AND function, OR function, NAND function, NOR function, NOT function of said logic block inputs. A configurable multiplexer can connect the second input to the control input of the latch. A configurable multiplexer can connect the latch output to a programmable logic block input. The logic block can provide one or more of: look-up-table (LUT), multiplexer circuit, NAND gate, NOR gate, AND gate, OR gate, XOR gate, product-term, register, processor, and Arithmetic-Logic-Unit circuit in the logic block. One or more configuration memory elements can be configured. The configuration memory elements can be one or more of SRAM, DRAM, EPROM, EEPROM, ROM, fuse-link, anti-fuse capacitor, magnetic, optical, ferro-electric, resistive, and mechanical memory elements.

In yet another aspect, a configurable circuit to implement a multiply logic function includes a latch output coupled to a logic block input, wherein the latch output computes an AND function of a first and second latch input.

Implementations of the configurable circuit can include one or more of the following. A configuration circuit can configure the latch and the logic block. A configurable multiplexer can be connected to the latch input or output.

In yet another aspect, a multiplier is formed using a storage element having an output reflecting a stored data state; a first logic input coupled to the storage element to store the data state; a global control signal coupled to the storage element to change the stored data state; and a second logic input programmably coupled to the global control signal to generate an AND output from the first and second logic inputs, wherein the storage element comprises a multiplier.

In a further aspect, method of providing a multiplier includes coupling a first logic input to an input of a latch used for storing a data state in the latch; and providing a configurable element to couple a second logic signal to a global control signal used for globally changing the stored data state in the latch, wherein, when the configurable element is programmed to couple the second logic input to the global control signal, the output generates a multiplication of the first and second logic inputs.

In yet another aspect, a logic circuit includes a logic block comprising a plurality of logic inputs and at least one logic output, the logic output generating a logic function of the plurality of logic inputs; and a latch having: a first latch input to store a data state coupled to said at least one output of logic block; a global latch input to change the stored data state of the latch couple by a programmable method to a local input; and a latch output, wherein when the local input is coupled to the global latch input, the latch output generates a logic function of the logic output and the local input wherein the latch provides a multiplier output.

In a further aspect, a programmable logic device includes a programmable logic output of one or more primary programmable inputs; a secondary programmable input; and a multiplier formed with a latch having the programmable logic output and the secondary programmable input coupled to the latch to multiply the primary and secondary inputs.

BRIEF DESCRIPTION OF THE DRAWINGS

FIG. 1 shows a conventional latch.

Figure 2:
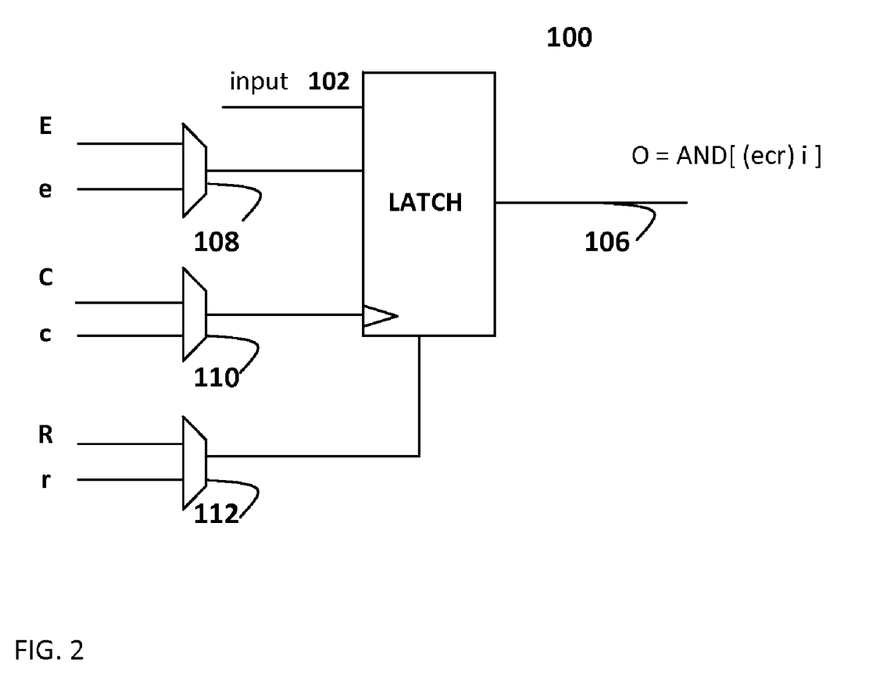

FIG. 2 shows an exemplary latch implementing logic functions.

Figure 3:
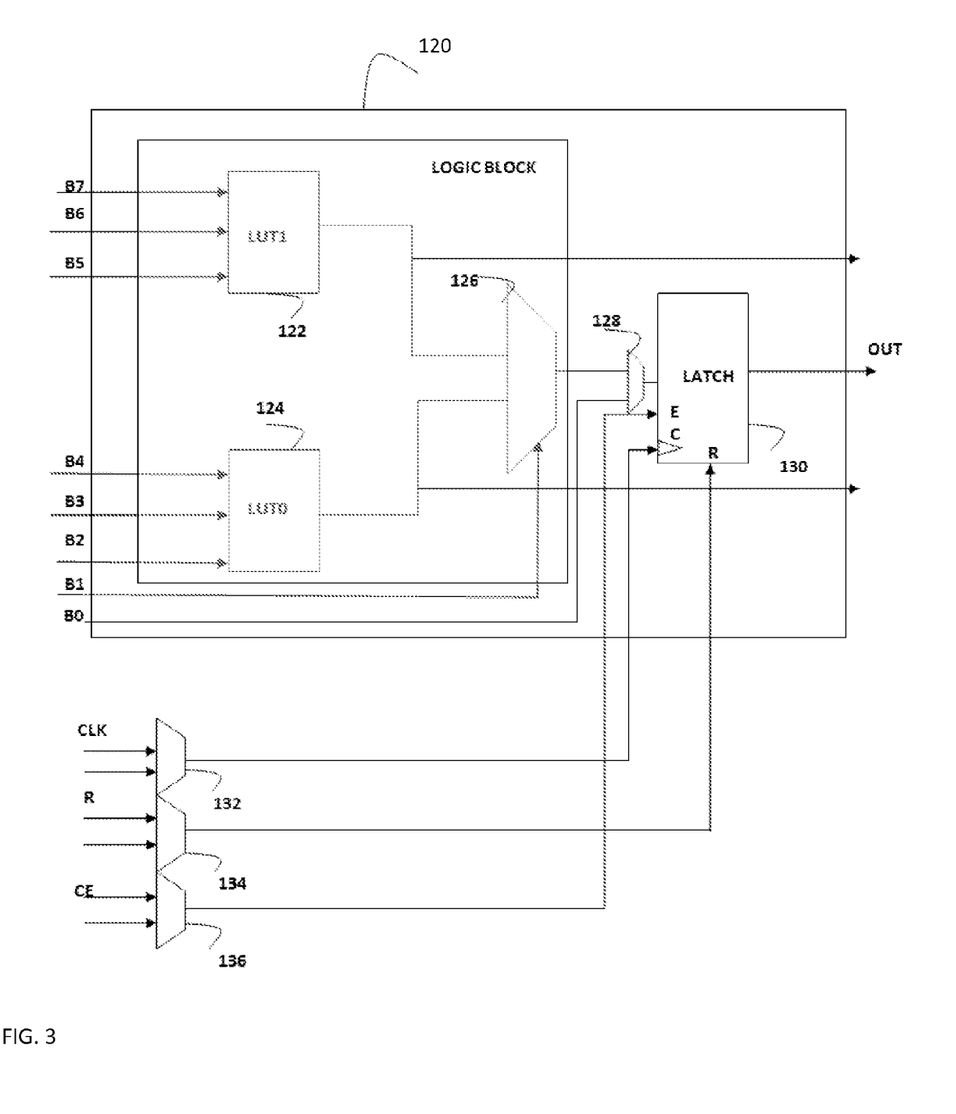

FIG. 3 shows an exemplary logic block based latch.

Figure 4:
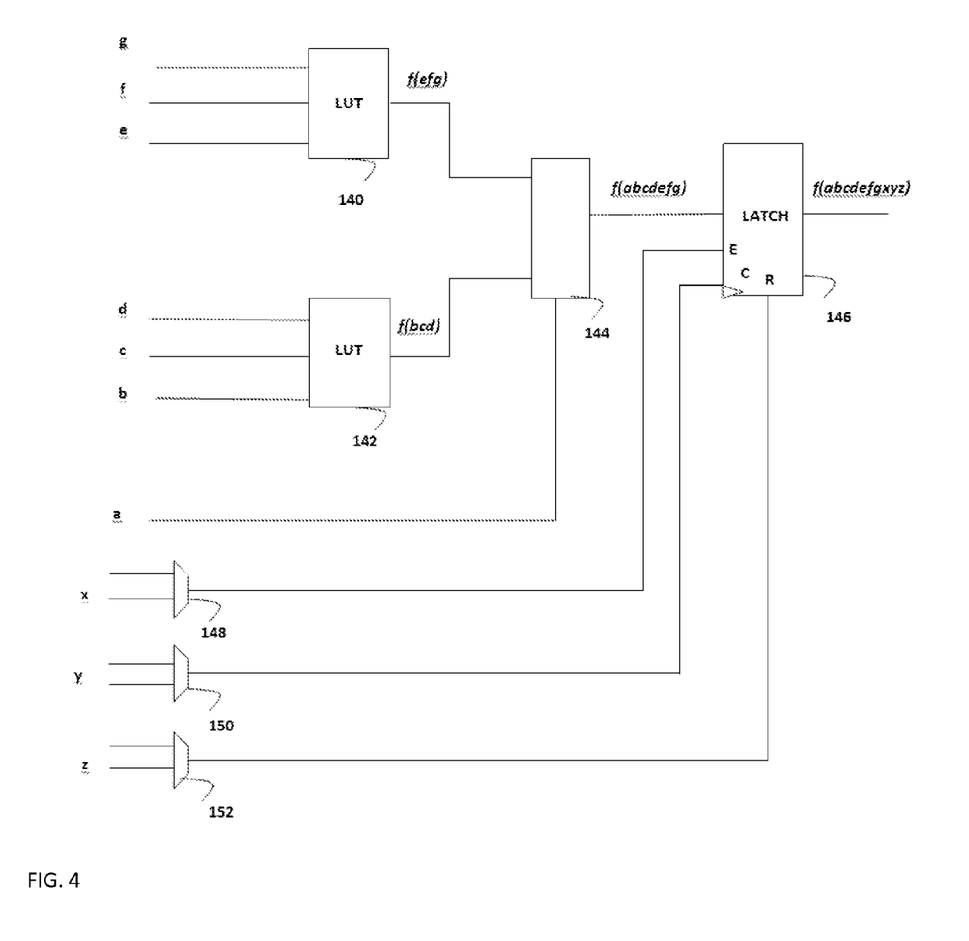

FIG. 4 shows an exemplary wide function logic block based latch.

Figure 5:
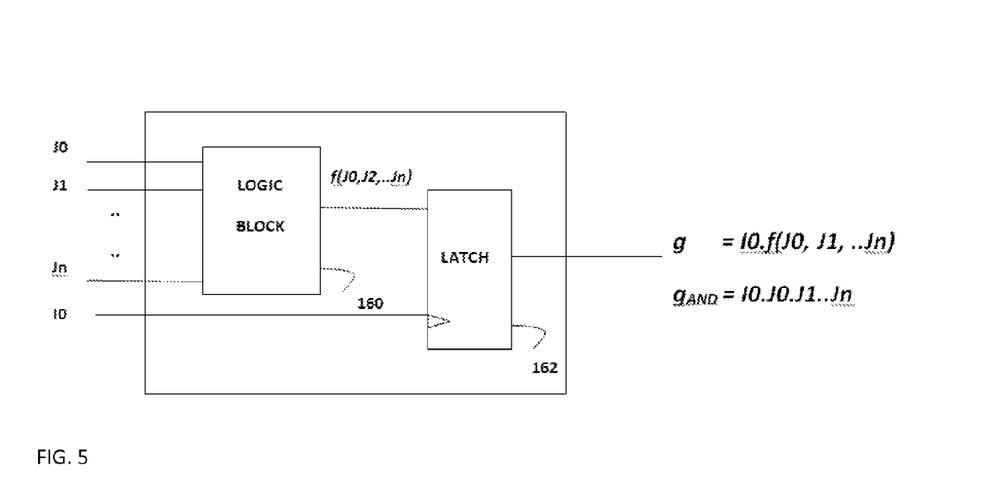

FIG. 5 shows a second exemplary wide function logic block based latch.

Figure 6:
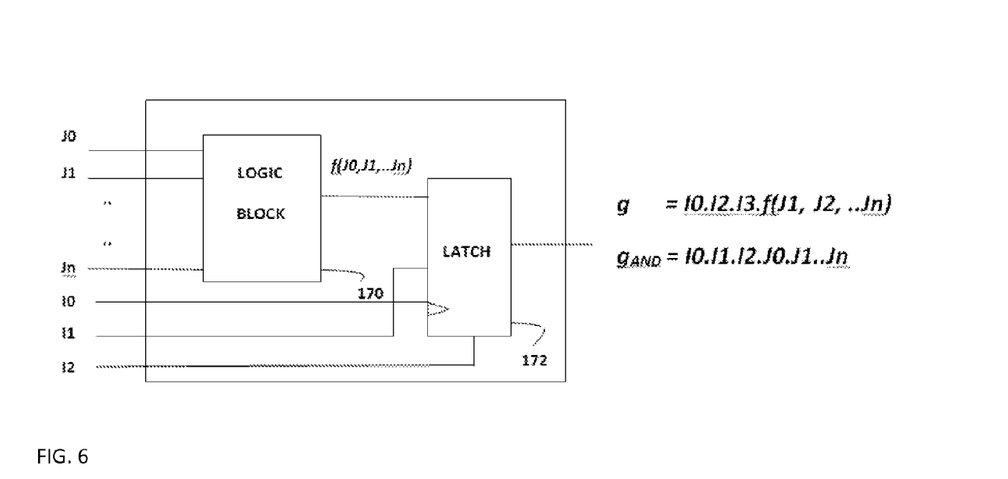

FIG. 6 shows a third exemplary wide function logic block based latch.

Figure 7:
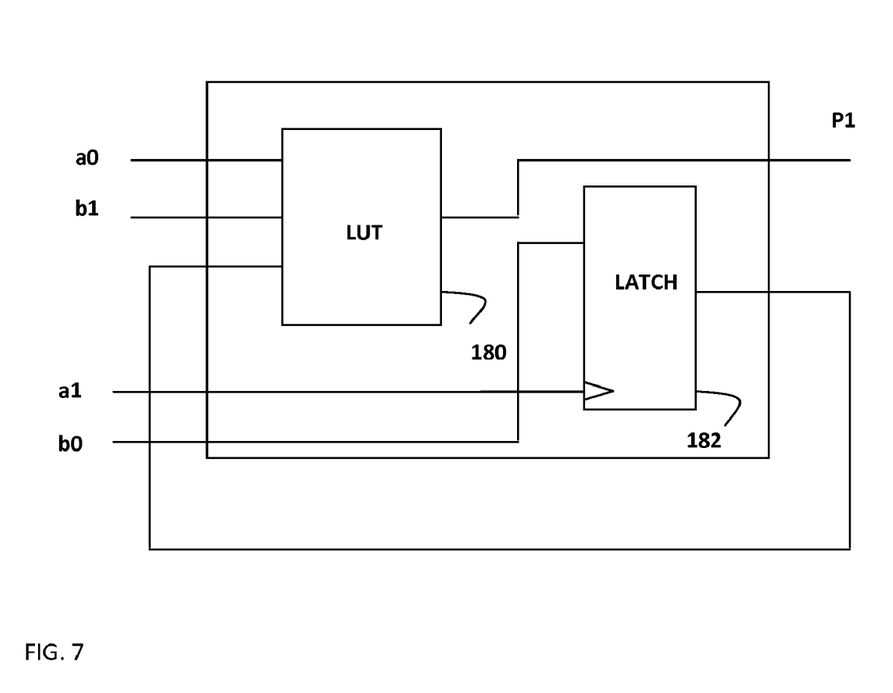

FIG. 7 shows an exemplary use of the latch implementing a multiplier function.

Figure 8:
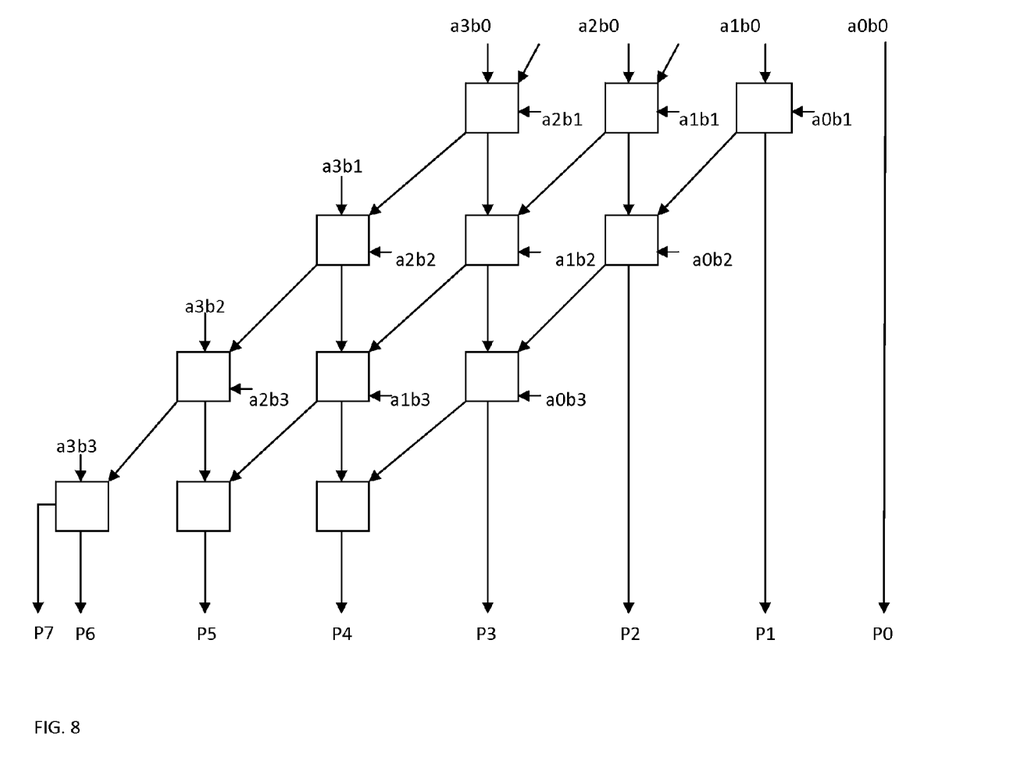

FIG. 8 shows an exemplary latch-based multiplier configuration.

Figure 9:
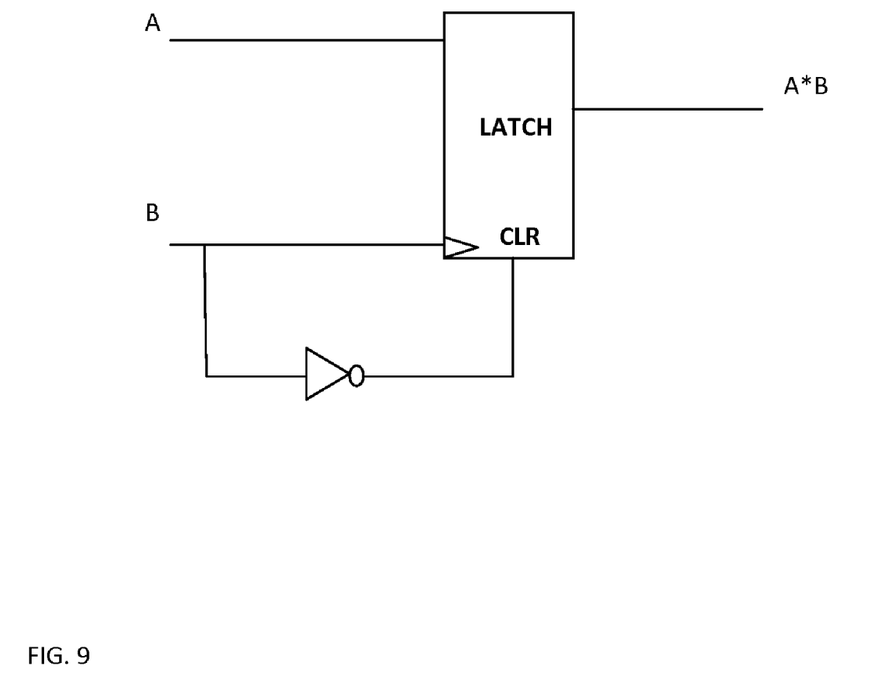
Figure 10:
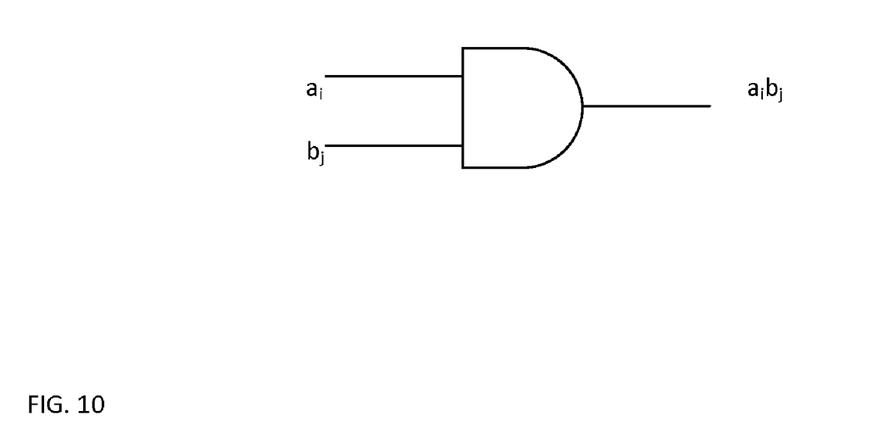

FIG. 9 shows a latch configured as a two-input AND gate, and FIG. 10 shows the equivalent logic function thereof.

Figure 11:
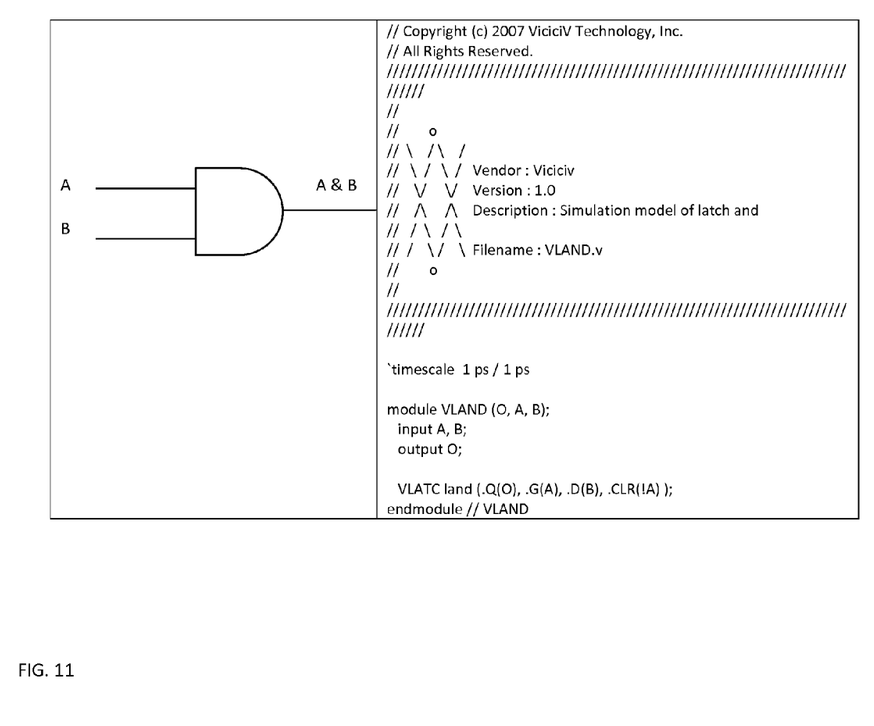

FIG. 11 shows an exemplary Verilog description of the latch based two-input AND gate.

Figure 12:
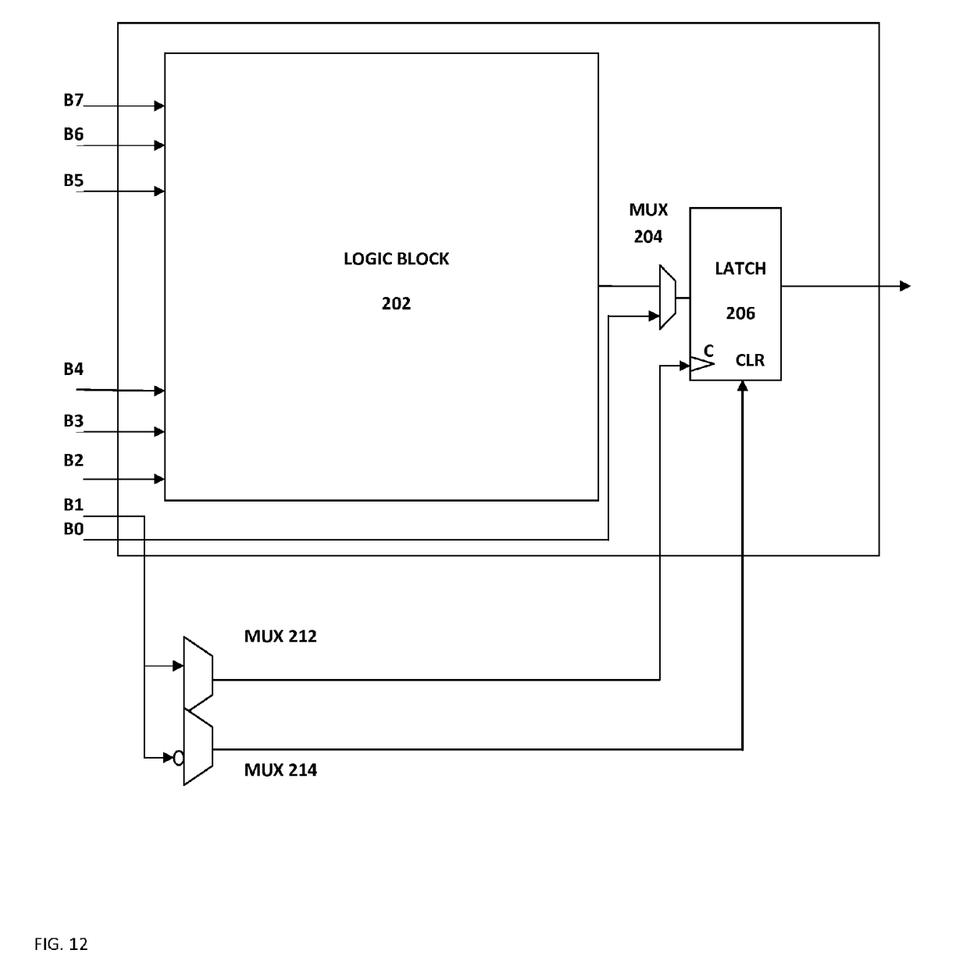

FIG. 12 shows an exemplary feedback connection from the latch to a look up table (LUT).

Figure 13:
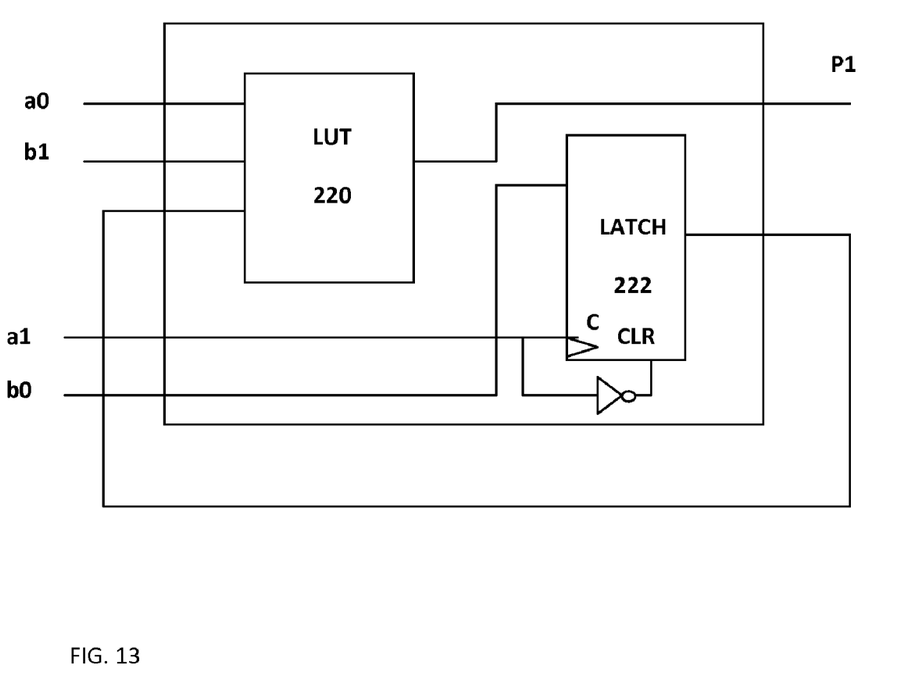

FIG. 13 shows an exemplary 2×2 latch-based multiplier.

Figure 14:
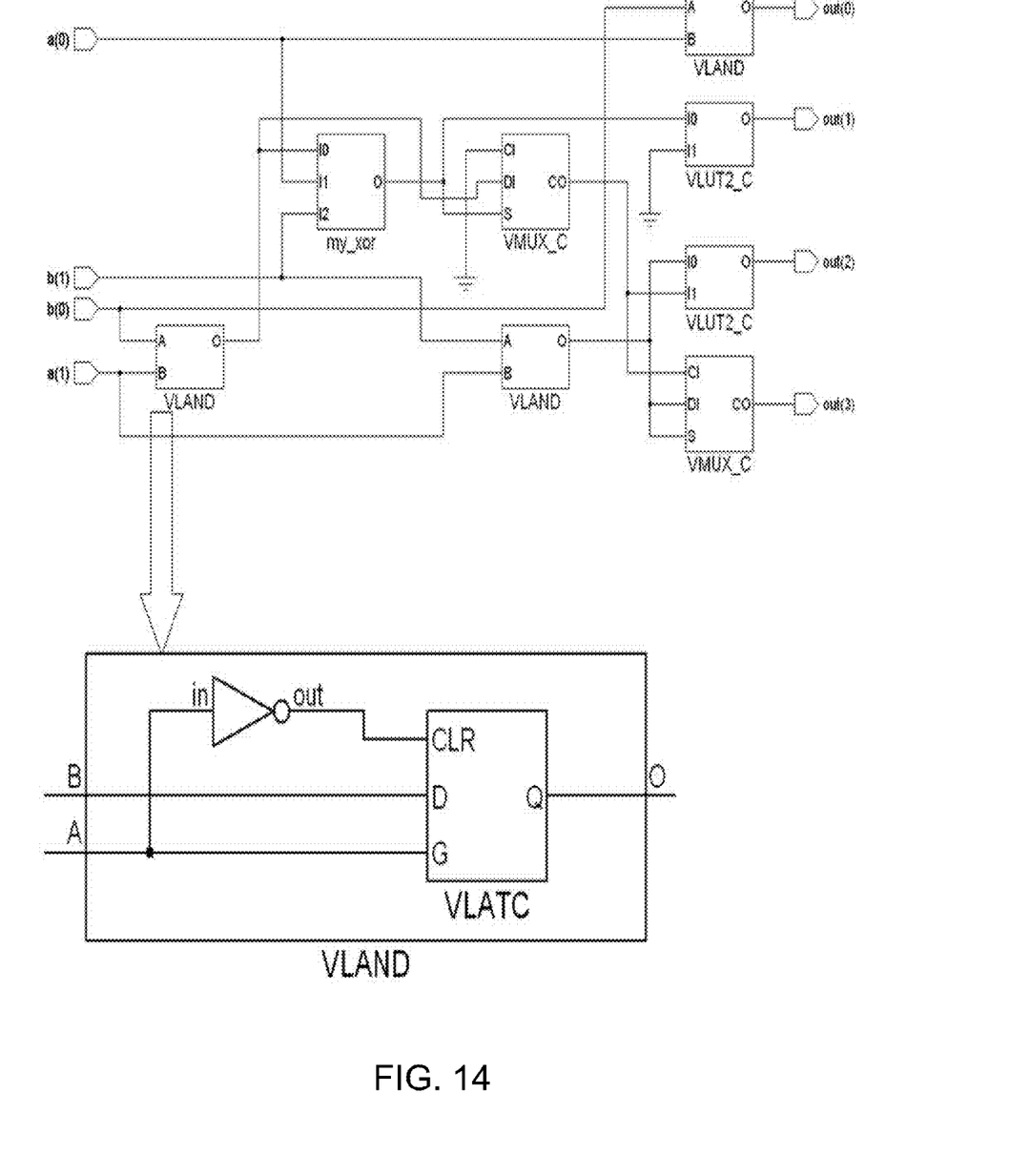
Figure 15:
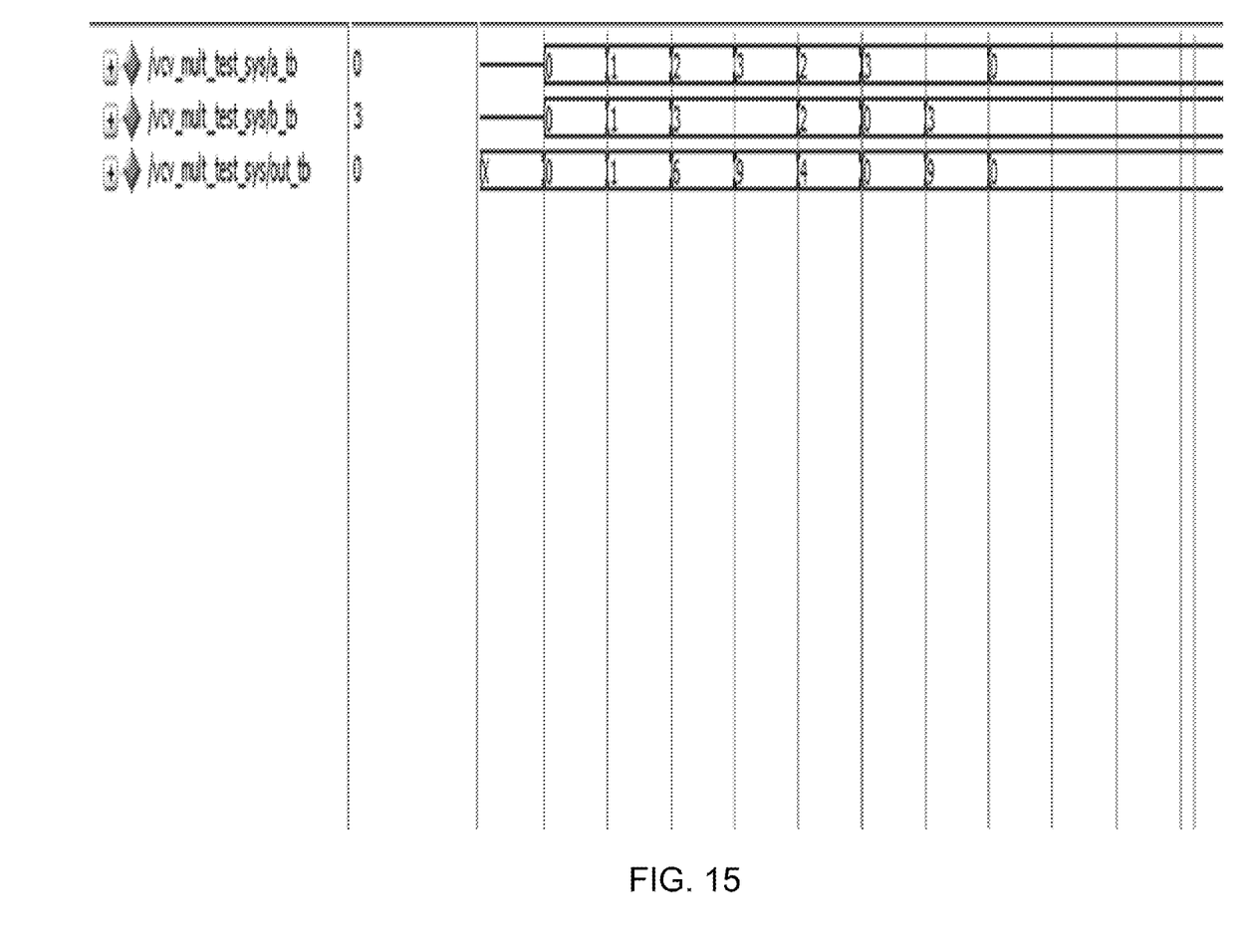

FIGS. 14 and 15 shows simulated functionality of an exemplary latch-based 2×2 multiplier.

DESCRIPTION

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it will be obvious to one of ordinary skill in the art that the present invention may be practiced without these specific details. In other instances, well known methods, procedures, components, and circuits have not been described in detail as not to unnecessarily obscure aspects of the present invention.

Referring now to FIG. 2, an exemplary latch 100 implementing logic functions is shown. The latch 100 has an input 102 to receive and store input data based on the enable, clock and reset control signals. A multiplexer (mux) 108 receives a global enable signal E and a local enable signal e and the output of the mux 108 is provided to the enable control of the latch 100. Similarly, a multiplexer (mux) 110 receives a global clock signal C and a local clock signal c and the output of the mux 110 drives the clock input of the latch 100. Additionally, a multiplexer (mux) 112 receives a global reset signal R and a local reset signal r and the output of the mux 112 is provided to the reset control of the latch 100. The output 106 of the latch 100 is an AND function of the local signals e, c and r and the input 102. Input 102 may be an output of a programmable logic block, an output of a register or a global input signal.

FIG. 3 shows an exemplary logic block based latch 120. In this latch, a look up table (LUT) 124 receives inputs B2, B3 and B4, respectively. Similarly, LUT 122 receives inputs B5, B6, B7. The outputs of the LUTs 122 & 124 are provided to a mux 126 which is controlled by input B1. The output of mux 126 is provided to another mux 128 which receives B0 at a second input. The output of the mux 128 is provided to the input of a latch 130.

Turning now to the control signals for the latch 130, a multiplexer (mux) 136 receives a global enable signal E and a local enable signal e and the output of the mux 136 is provided to the enable control of the latch 130. Similarly, a multiplexer (mux) 132 receives a global clock signal C and a local clock signal c and the output of the mux 132 drives the clock input of the latch 130. Additionally, a multiplexer (mux) 134 receives a global reset signal R and a local reset signal r and the output of the mux 134 is provided to the reset control of the latch 130. The output of the latch 130 is a logic function which in this embodiment is an AND of the local signals e, c and r and the inputs B0-B7. The local signals may be generated by other logic blocks such as LUT element 124.

FIG. 4 shows an exemplary wide function logic block based latch. An LUT 140 receives inputs e, f, and g and generates an output f(efg). Similarly, an LUT 142 receives inputs b, c, d and generates an output f(bcd). A logic unit 144 receives an input a and combines a with the outputs of LUTs 140 & 142 to generate an output f(abcdefg) and provides this output to the input of a latch 146.

A multiplexer (mux) 148 receives a global enable signal E and a local enable signal e and the output of the mux 148 is provided to the enable control of the latch 146. Similarly, a multiplexer (mux) 150 receives a global clock signal C and a local clock signal c and the output of the mux 150 drives the clock input of the latch 146. Additionally, a multiplexer (mux) 152 receives a global reset signal R and a local reset signal r and the output of the mux 152 is provided to the reset control of the latch 146. The output of the latch 146 is a wide logic function which in this case is an AND function f(abcdefgxyz).

FIG. 5 shows a second exemplary wide function logic block based latch. In this example, logic block 160 receives inputs J0 . . . Jn and generates an output f(J0, J1, . . . Jn) which is connected to the input of a latch 162. The latch 162 is clocked by an input I0, and the output of the latch generates g=I0 AND f(J0, J1 . . . Jn). In another view, the latch 162 outputs $g_{AND}$=I0 AND J0 AND J1 . . . AND Jn.

FIG. 6 shows a third exemplary wide function logic block based latch. The example of FIG. 6 provides reset and enable inputs in addition to the clock input to the latch. In this example, logic block 160 receives inputs J0 . . . Jn and generates an output f(J0, J1, . . . Jn) which is connected to the input of a latch 162. The latch 162 is clocked b an input I0, and the output of the latch is g=I0 AND f(J0 ... Jn). Equivalently, the latch 162 outputs $g_{AND}$=I0 AND J0 AND J1 ... AND Jn.

FIG. 7 shows an exemplary use of the latch implementing a multiplier function. The device of FIG. 7 multiplies two numbers a×b, each two bits wide as an example:

```
            a1    a0
         ×  b1    b0
           a1b0  a0b0
      a1b1  a0b1
   P3   P2    P1    P0
```

In FIG. 7, an LUT 180 receives a0 and b1 as inputs, while a latch 182 receives a1 and b0 as inputs. The output of the latch 182 is provided as an input to the LUT 180. The output of the LUT 180 is P1. In this example, a1b0 is determined by the latch 182, and the a1b0 is provided as an input to the LUT 180. The LUT 180 performs an AND operation on a0b1 and then adds the a1b0 to a0b1 as the output P1.

FIG. 8 shows an exemplary latch-based multiplier configuration for a 4×4 multiplier. The multiplier of FIG. 8 implements the following

```
                       a3    a2    a1    a0
                    ×  b3    b2    b1    b0
                      a3b0  a2b0  a1b0  a0b0
                 a3b1  a2b1  a1b1  a0b1
           a3b3  a2b2  a1b2  a0b2
     a3b3  a2b3  a1b3  a0b3
  P7   P6    P5    P4    P3    P2    P1    P0
```

As shown in FIG. 8, the multiplier output bit P1 is the sum of the partials a1b0 and a0b1. Similarly, the multiplier output bit P2 is the sum of partials a2b0+a1b1+a0b2. This process is repeated until bit P6=a3b3 and P7 as the carry bit from P6.

FIG. 9 shows a latch configured as a two-input AND gate. In FIG. 9, the latch has a clock input B and a reset input CLR which receives an inverted B signal. FIG. 10 shows the equivalent logic function thereof.

FIG. 11 shows an exemplary Verilog description of the latch based two-input AND gate. The latched AND module is described as:

module VLAND (O, A, B);

input A, B;

output O;

VLATC land (.Q(O), .G(A), .D(B), .CLR(!A));

endmodule//VLAND

FIG. 12 shows an exemplary feedback connection from the latch to a look up table (LUT). In the embodiment of FIG. 12, a logic block 202 receives inputs B2 ... B7. The logic block provides an output that drives a multiplexer 204. The MUX 204 also receives B0. The output of the MUX 204 is provided to a latch 206. The latch 206 is clocked by a MUX 212 whose input is B1. An inverted B1 is provided to a MUX 214 which drives the reset input CLR of the latch 206. The feedback connection of FIG. 12 can be used in a multiplier as shown in FIG. 13.

FIG. 13 shows an exemplary 2×2 latch-based multiplier. In FIG. 13, an LUT 220 receives inputs a0 and b1 and a feedback from the output of a latch 222. The output of the LUT 220 is P1. The latch 222 is clocked by a1 and the latch 222 stores the input b0. The reset input of the latch 222 is an inverted version of a1. The circuit of FIG. 13 implements a 2×2 multiplier as follows:

```
            a1    a0
         ×  b1    b0
           a1b0  a0b0
      a1b1  a0b1
   P3   P2    P1    P0
```

FIG. 14 shows schematic of a 2×2 latch based multiplier. LATCH_AND is highlighted in the schematic.

FIG. 15 shows the functional simulation waveform for the 2×2 multiplier.

operand a (a_tb in FIG. 15) with values {0, 1, 2, 3, 2, 3, 3, 0} at different time steps    operand b (b_tb in FIG. 15) with values {0, 1, 3, 3, 2, 0, 3, 3} at different time steps    result of a×b (out_tb in FIG. 15) with values {0, 1, 6, 9, 4, 0, 9, 0} at different time steps The latch may be an SRAM cell, or include an SRAM cell. One or more transistors of the latch may comprise thin film transistors constructed in a semiconductor thin film layer located substantially above logic transistors. The TFT transistors are buried above the logic gates of an Integrated Circuit to consume no extra Silicon real estate, as discussed in commonly owned United States Patent Applications 20040207100 and 20060146596, the contents of which are incorporated by reference. On or more transistors of the latch may be constructed in Silicon substrate layer adjacent to logic gates of an Integrated Circuit. One or more programmable inputs or outputs of the latch may be configured by TFT transistors and TFT memory devices located substantially above or below latch transistors.

In certain embodiments, the latch implementing logic functions can work with antifuses. The antifuse is suitable for virtually any integrated circuit where a fuse or antifuse is desirable to store permanent data. For example, the antifuse can be used as part of a generic integrated memory address circuit to select redundant rows or columns within a ROM, EEROM, PROM, flash RAM, or DRAM. In many embodiments, the integrated circuit is part of a larger system, such as computer system or more generally a computerized system including a microprocessor or digital signal processor coupled to the memory circuit. In addition to the antifuses, memory address circuit includes a set of address transistors, a set of redundant address transistors, and conventional laser fuses. Address transistors are conventionally used to address rows or columns in the memory array. Each row or column includes one or more memory cells. One or more of the above antifuses and one or more of laser fuses can be selectively programmed to replace one or more of memory rows or columns with redundant memory row or column. In some embodiments, one or more of the antifuses are programmed and one or more others remain unprogrammed, and in some embodiments all the antifuses are either programmed or unprogrammed.

The LUT can be circuits as disclosed in commonly owned United States Patent Applications 20070171105 and 20070035329, the contents of which are incorporated by reference. The LUT makes use of additional programmable elements inside the large LUT structure, enabling sub-division of LUTs. A complex design can be fitted as a single larger logic LUT or as many smaller logic LUT pieces: both maximizing the Silicon utilization. In the reference, a 2LUT divisible 4LUT macro-cell (shown in FIG. 16A) provides a 2× improvement in logic packing compared to hard-wired 4LUT logic elements. The increased memory content is justified by a 3-dimensional thin-film transistor module integration that allows all configuration circuits to be built vertically above logic circuits. These memory circuits contain TFT memory elements that control pass-gates constructed in substrate Silicon. The TFT layers are fabricated above a metal layer in a removable module, facilitating a novel method to remove completely from the process in preference to hard-wired replacements. Configuration circuits are mapped to a hard-wire metal links to provide the identical functionality in the latter. Once the programming pattern is finalized with the thin-film module, and the device is tested and verified for performance, the TFT cells can be eliminated by hard-wire connections. Such conversions allow the user a lower cost and more reliable end product. These products offer an enormous advantage in lowering NRE costs and improving TTS in the ASIC design methodology in the industry.

The latch can be used in a generic field programmable gate array (FPGA) or an application specific integrated circuit (ASIC). In both cases the logic content mapped to LUTs is further enhanced by creating larger logic functions including extra inputs and the latch. Thus less Si (hence cheaper) and faster logic computations are achieved by the disclosed latch logic mapping. Although an illustrative embodiment of the present invention, and various modifications thereof, have been described in detail herein with reference to the accompanying drawings, it is to be understood that the invention is not limited to this precise embodiment and the described modifications, and that various changes and further modifications may be effected therein by one skilled in the art without departing from the scope or spirit of the invention as defined in the appended claims.

What is claimed is:

1. A programmable logic circuit to implement a multiplier, comprising:
   a latch comprising:
      a latch input to receive a first data input;
      a latch control input to receive a second data input;
      a latch output generating an AND function of the latch input and the control input;
      configuration memory elements coupled to the latch output; and
   a logic block comprising:
      an input coupled to the latch output;
      one or more data inputs; and
      a logic output to generate a partial logic term of a multiply operation.

2. The circuit of claim 1, wherein the control input is one of clock input, set input, and reset input.

3. The circuit of claim 1, wherein the first data input is a bit in a first data stream and the second data input is a bit in a second data stream and wherein the circuit implements the multiplication of the two data streams.

4. The circuit of claim 1, wherein the partial logic term is one of AND and XOR logic functions of latch output and one or more logic block data inputs.

5. The circuit of claim 1, wherein the logic block comprises a plurality of programmable inputs.

6. The circuit of claim 1, wherein the latch data input and latch control input are programmable.

7. The circuit of claim 1, wherein the logic block comprises one or more of: programmable look-up-table (LUT) circuit, programmable multiplexer (MUX) circuit, programmable arithmetic logic circuit and programmable AND circuit and programmable NAND circuit.

8. The circuit of claim 1, wherein one or more of the inputs couple to a programmable interconnect matrix through one or more configurable multiplexer circuits.

9. The circuit of claim 1, comprising configuration memory elements coupled to the latch output.

10. The circuit of claim 1, wherein the configuration memory elements comprising one or more of SRAM, DRAM, EPROM, EEPROM, ROM, fuse-link, anti-fuse capacitor, magnetic, optical, ferro-electric, resistive, and mechanical memory elements.

11. A method of implementing a multiply logic function in a programmable logic block, the method comprising:
   providing a first input to a programmable data input of a latch and a second input to a programmable control input of a latch;
   generating an AND term of the first and second inputs at a latch output;
   coupling the latch output and one or more data inputs to programmable inputs of a programmable logic block to generate a partial logic term of the inputs; and
   providing configuration memory elements coupled to the latch output.

12. The method of claim 11, wherein the partial logic term computes one of: AND function, OR function, NAND function, NOR function, NOT function of said logic block inputs.

13. The method of claim 11, comprising configuring a configurable multiplexer to couple the second input to the control input of the latch.

14. The method of claim 11, comprising configuring a configurable multiplexer to couple the latch output to a programmable logic block input.

15. The method of claim 11, comprising providing one or more of: look-up-table (LUT), multiplexer circuit, NAND gate, NOR gate, AND gate, OR gate, XOR gate, product-term, register, processor, and Arithmetic-Logic-Unit circuit in the logic block.

16. The method of claim 11, comprising configuring one or more configuration memory elements.

17. The method of claim 15, wherein the configuration memory elements comprising one or more of SRAM, DRAM, EPROM, EEPROM, ROM, fuse-link, anti-fuse capacitor, magnetic, optical, ferro-electric, resistive, and mechanical memory elements.

18. A configurable circuit to implement a multiply logic function, the circuit comprising:
   a logic block; and
   a latch having a latch output coupled to a logic block input, wherein the latch output computes an AND function of a first and second latch input; and
   configuration memory elements coupled to the latch output.

19. The circuit of claim 18 comprising a configuration circuit to configure the latch and the logic block.

20. The circuit of claim 18, comprising a configurable multiplexer coupled to the latch.

* * * * *